(12) United States Patent
Chen et al.

(10) Patent No.: US 11,778,725 B2
(45) Date of Patent: Oct. 3, 2023

(54) THERMAL INTERFACE MATERIAL (TIM) FILLING STRUCTURE FOR HIGH WARPAGE CHIPS

(71) Applicant: Cisco Technology, Inc., San Jose, CA (US)

(72) Inventors: Yongguo Chen, Shanghai (CN); Yaotsan Tsai, San Jose, CA (US); Vic Hong Chia, Sunnyvale, CA (US); Hua Yang, Tracy, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/524,364

(22) Filed: Nov. 11, 2021

(65) Prior Publication Data

US 2023/0147492 A1    May 11, 2023

(51) Int. Cl.
 H05K 1/02    (2006.01)
 H05K 7/20    (2006.01)

(52) U.S. Cl.
 CPC ........... *H05K 1/0204* (2013.01); *H05K 1/021* (2013.01); *H05K 7/20336* (2013.01)

(58) Field of Classification Search
 CPC ....... H05K 1/0203–0204; H05K 1/021; H05K 1/181; H05K 7/20218; H05K 7/20254; H05K 7/2029; H05K 7/20336; H05K 7/20663; H05K 7/20881; H05K 7/20936; H01L 23/4275; H01L 23/4338; H01L 23/473; H01L 23/4334; H01L 23/3736; H01L 23/3672; H01L 23/427; H01L 23/5226; H01L 23/42; H01L 23/3114; H01L 23/31; H01L 23/36; H01L 23/3677; H01L 21/4882; H01L 2924/14; H01H 9/52

See application file for complete search history.

(56) References Cited

U.S. PATENT DOCUMENTS

| | | | |
|---|---|---|---|
| 6,391,442 B1* | 5/2002 | Duvall | F28D 20/02 428/407 |
| 10,262,920 B1* | 4/2019 | Refai-Ahmed | H01L 23/4275 |
| 2003/0085475 A1* | 5/2003 | Im | H01L 23/16 257/796 |
| 2003/0193791 A1* | 10/2003 | Panella | H01L 23/49805 257/E23.079 |
| 2004/0042178 A1* | 3/2004 | Gektin | H01L 23/433 257/E23.09 |
| 2004/0190253 A1* | 9/2004 | Prasher | H01L 23/427 361/699 |
| 2015/0145118 A1* | 5/2015 | Lee | H01L 23/34 257/713 |
| 2016/0315030 A1* | 10/2016 | Strader | H01L 23/42 |
| 2019/0261502 A1* | 8/2019 | Johansen | H05K 3/34 |

(Continued)

*Primary Examiner* — Amir A Jalali
(74) *Attorney, Agent, or Firm* — Merchant & Gould P.C.

(57) ABSTRACT

A Thermal Interface Material (TIM) for chip warpage may be provided. A system may comprise an Integrated Circuit (IC) chip, a Thermal Interface Material (TIM) layer disposed on the IC chip, and a heatsink disposed on the TIM layer. The heatsink may comprise, a plate, a plurality of fins, and at least one TIM storage chamber disposed in the plate between two of the plurality of fins. The at least one TIM storage chamber may be filled with a TIM that is solid at a lower temperature end of a thermal cycle of the IC chip and that is liquid at a higher temperature end of the thermal cycle of the IC chip.

20 Claims, 6 Drawing Sheets

(56) References Cited

U.S. PATENT DOCUMENTS

2020/0203254 A1\* 6/2020 Dhane ..................... H01L 23/42
2020/0219789 A1    7/2020 Uppal et al.
2020/0350231 A1\* 11/2020 Shen ................... H01L 23/4334
2021/0392783 A1\* 12/2021 Li ...................... H05K 7/20336

\* cited by examiner

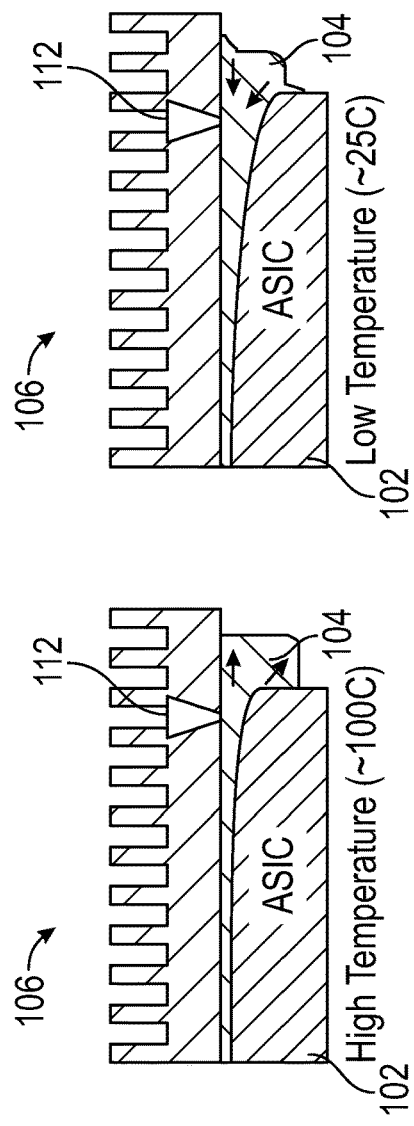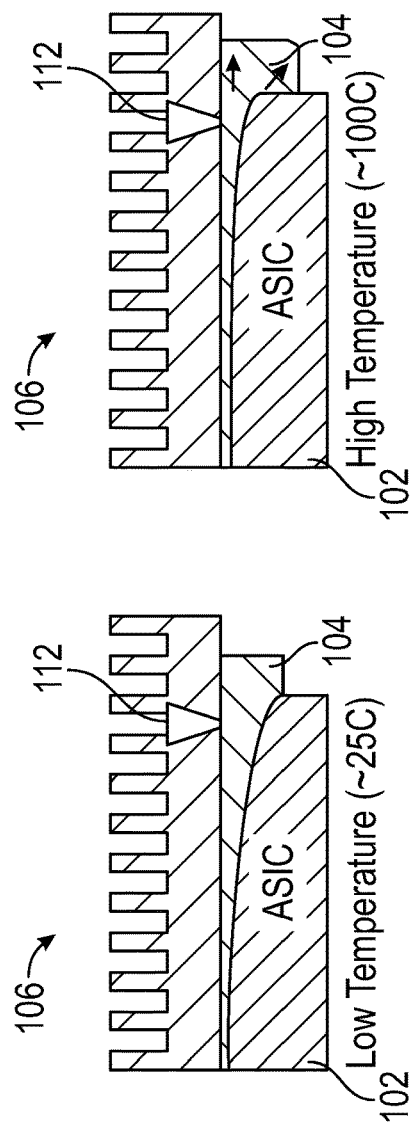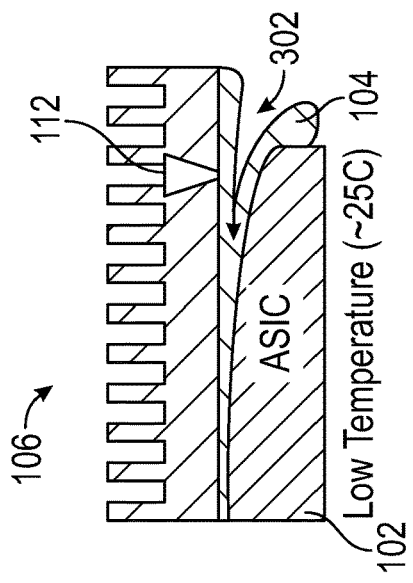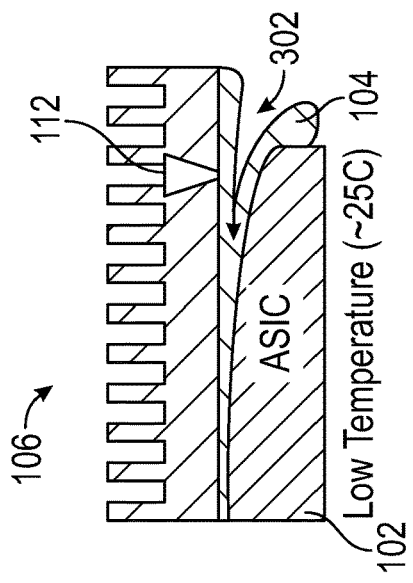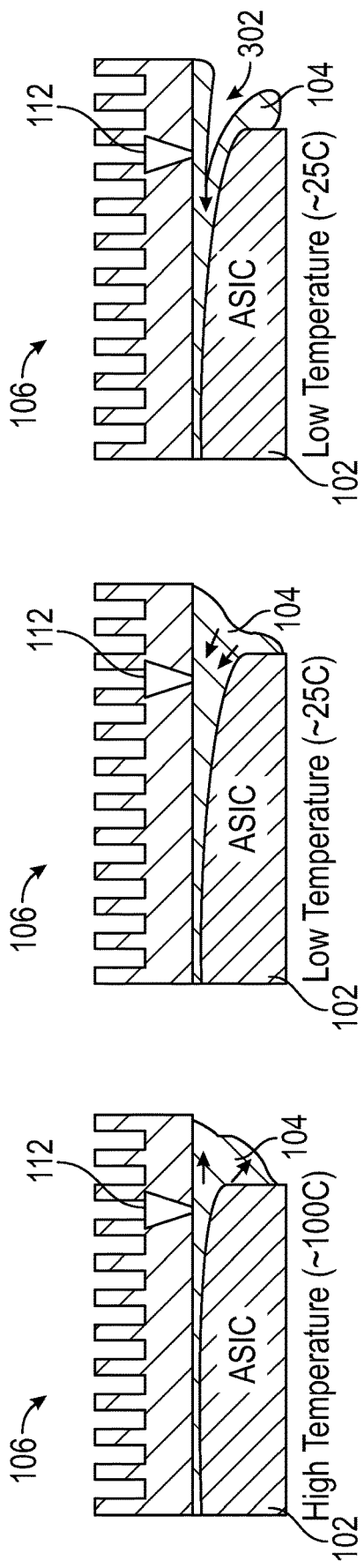

THERMAL INTERFACE MATERIAL (TIM) FILLING STRUCTURE FOR HIGH WARPAGE CHIPS

TECHNICAL FIELD

The present disclosure relates generally to Thermal Interface Material (TIM) filling.

BACKGROUND

A heatsink is a passive heat exchanger that transfers the heat generated by an electronic or a mechanical device to a fluid medium, often air or a liquid coolant, where it is dissipated away from the device, thereby allowing regulation of the device's temperature. In computers, heat sinks are used to cool Central Processing Units (CPUs) and some chipsets and Random Access Memory (RAM) modules. Heat sinks are used with high-power semiconductor devices such as power transistors and optoelectronics such as lasers and Light-Emitting Diodes (LEDs), where the heat dissipation ability of the component itself is insufficient to moderate its temperature.

A heat sink is designed to maximize its surface area in contact with the cooling medium surrounding it, such as the air. Air velocity, choice of material, protrusion design, and surface treatment are factors that affect the performance of a heat sink. Heat sink attachment methods and thermal interface materials also affect the die temperature of the integrated circuit. Thermal adhesive or thermal paste improve the heat sink's performance by filling air gaps between the heat sink and the heat spreader on the device. A heat sink is usually made out of aluminum or copper.

BRIEF DESCRIPTION OF THE FIGURES

The accompanying drawings, which are incorporated in and constitute a part of this disclosure, illustrate various embodiments of the present disclosure. In the drawings:

FIG. 3A, FIG. 3B, FIG. 3C, FIG. 3D, FIG. 3E, and FIG. 3F illustrate TIM pump-out due to thermal cycling;

DETAILED DESCRIPTION

Overview

Figure 1:
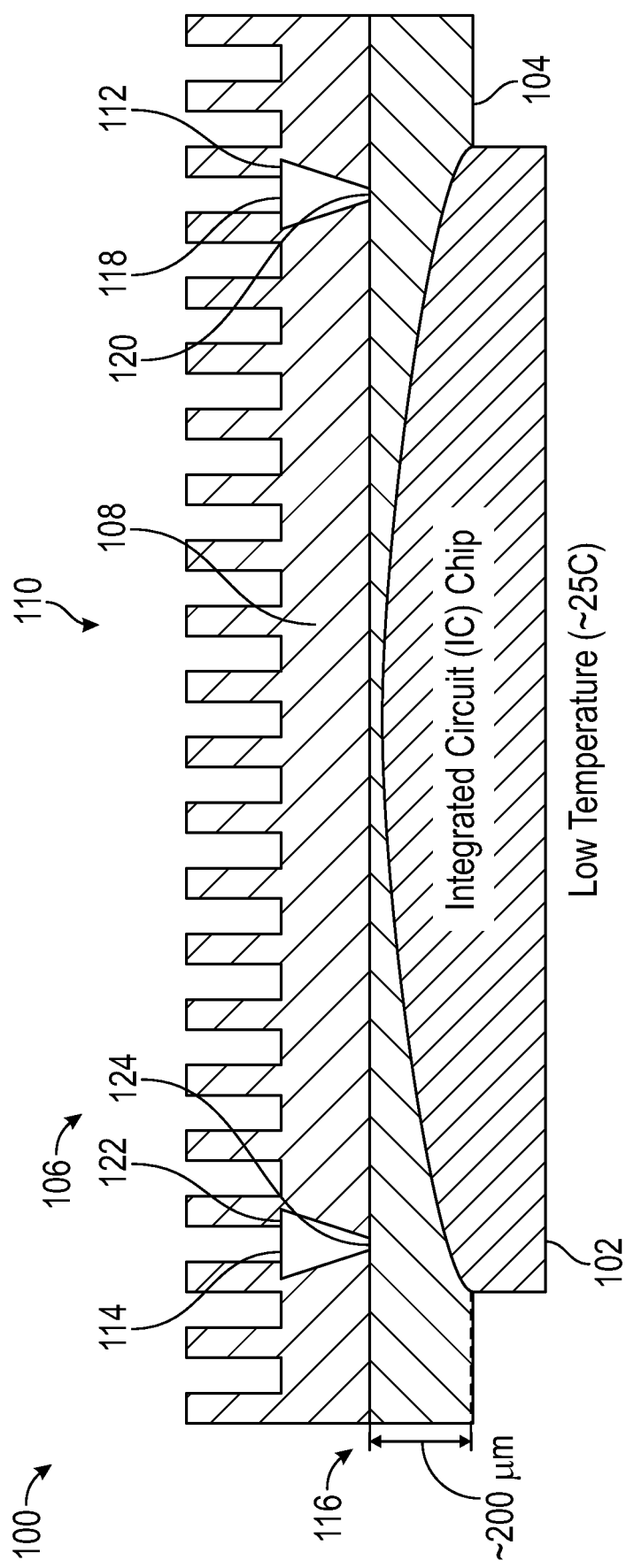
FIG. 1 shows an operating environment for Thermal Interface Material (TIM) filling.

A Thermal Interface Material (TIM) for chip warpage may be provided. A system may comprise an Integrated Circuit (IC) chip, a Thermal Interface Material (TIM) layer disposed on the IC chip, and a heatsink disposed on the TIM layer. The heatsink may comprise, a plate, a plurality of fins, and at least one TIM storage chamber disposed in the plate between two of the plurality of fins. The at least one TIM storage chamber may be filled with a TIM that is solid at a lower temperature end of a thermal cycle of the IC chip and that is liquid at a higher temperature end of the thermal cycle of the IC chip.

Both the foregoing overview and the following example embodiments are examples and explanatory only and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Integrated Circuit (IC) chips (e.g., Application Specific Integrated Circuits ASICs) may be deployed with heatsinks on top of the IC chip along with a Thermal Interface Material (TIM) layer disposed between the IC chip and the heatsink. The TIM layer aids in transferring heat (i.e., thermal conduction) from the IC chip to the heatsink. As the IC chip is operated, it may go through a thermal cycle where it may heat up for a period of time and then it may cool down for a period of time. The increased heat may be caused by increasing the workload of the IC chip and the decreased heat may be caused by decreasing the workload of the IC chip.

During each thermal cycle, a warpage of the IC chip may vary. A greater warpage may occur at a lower temperature end of a thermal cycle and less warpage may occur at a higher temperature end of the thermal cycle. Over many thermal cycles, this change in the warpage may pump out some of the TIM layer leaving an air void. This is known as TIM pump-out due to thermal cycling. Consequently, the thermal conduction between the IC chip and the heartsick is lost at these voids. Furthermore, as the profile of IC chips increases in size, warpage becomes even more profound, making the TIM coverage more challenging to provide an even spread on larger surface areas of larger IC chips.

To overcome TIM pump-out due to thermal cycling, embodiments of the disclosure may provide a thermal interface material storage chamber disposed in a plate of a heatsink between two of the heartsink's fins for example. The thermal interface material storage chamber may be filled with a thermal interface material that may be solid at a lower temperature end of a thermal cycle of the IC chip and that is liquid at a higher temperature end of the thermal cycle of the IC chip. Accordingly, the thermal interface material storage chamber may fill the aforementioned voids many times as voids appear and reappear in the TIM layer. In other words, embodiments of the disclosure may provide a TIM filling structure that may reduce the risk of TIM pump-out and may maintain a good thermal performance of high power IC chips (e.g., AISCs).

FIG. 1 shows a side view of an operating environment 100 for illustrating Thermal Interface Material (TIM) filling. As shown in FIG. 1, operating environment 100 may comprise an Integrated Circuit (IC) chip 102, a Thermal Interface Material (TIM) layer 104 disposed on IC chip 102, and a heatsink 106 disposed on TIM layer 104. Heatsink 106 may comprise a plate 108, a plurality of fins 110, and a plurality of TIM storage chambers disposed in plate 108 between two of plurality of fins 110 for example. The plurality of TIM storage chambers may comprise, but is not limited to, a first TIM storage chamber 112 and a second TIM storage chamber 114. While the example of FIG. 1 shows two TIM storage chambers, embodiments of the disclosure are not limited to two and may comprise any number of TIM storage chambers. IC chip 102 may comprise an ASIC, but is not limited to any type of IC chip. IC chip 102 may be a bare die or may have a lid. Heatsink 106, for example, may comprise a cold plate and may or may not include plurality of fins 110.

First TIM storage chamber 112 may comprise a first TIM storage chamber first opening 118 in a top side of plate 108 and a first TIM storage chamber second opening 120 in a bottom side of plate 108. First TIM storage chamber first opening 118 may be larger than first TIM storage chamber second opening 120. First TIM storage chamber 112 may comprise a conical frustum. Similarly, second TIM storage chamber 114 may comprise a second TIM storage chamber first opening 122 in the top side of plate 108 and a second TIM storage chamber second opening 124 in the bottom side of plate 108. Second TIM storage chamber first opening 122 may be larger than second TIM storage chamber second opening 124. Second TIM storage chamber 114 may comprise a conical frustum.

A lower temperature end of a thermal cycle of IC chip 102 is shown in FIG. 1. This lower temperature end may comprise, but is not limited to, approximately 25 degrees Celsius. At this temperature, a warpage 116 of IC chip 102 may comprise approximately 200 µm for example. Warpage 116 of approximately 200 µm at approximately 25 degrees Celsius is an example and warpage 116 not limited to approximately 200 µm.

Each of first TIM storage chamber 112 and second TIM storage chamber 114 may be disposed in plate 108 between two of plurality of fins 110. First TIM storage chamber 112 and second TIM storage chamber 114 may be filled with a TIM that is solid at the lower temperature end of the thermal cycle of IC chip 102 and that is liquid at a higher temperature end of the thermal cycle of IC chip 102.

The TIM comprising TIM layer 104 and used to fill the plurality of TIM storage chambers may comprise the same material and may have a low thermal impedance (e.g., high thermal conduction K and a thin Bond Line Thickness (BLT)). For example, the TIM may comprise, but is not limited to, a Phase Change Material (PCM) or a grease.

Figure 2A:
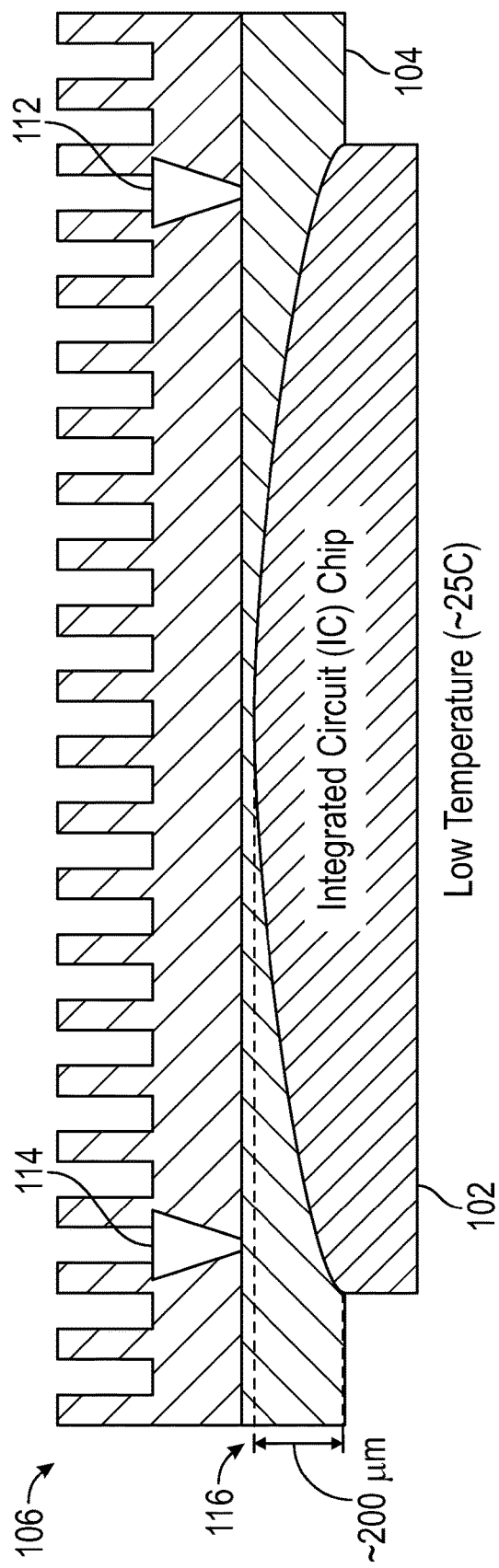
FIG. 2A and FIG. 2B illustrate Integrated Circuit (IC) chip warpage at different temperatures.
Figure 2B:
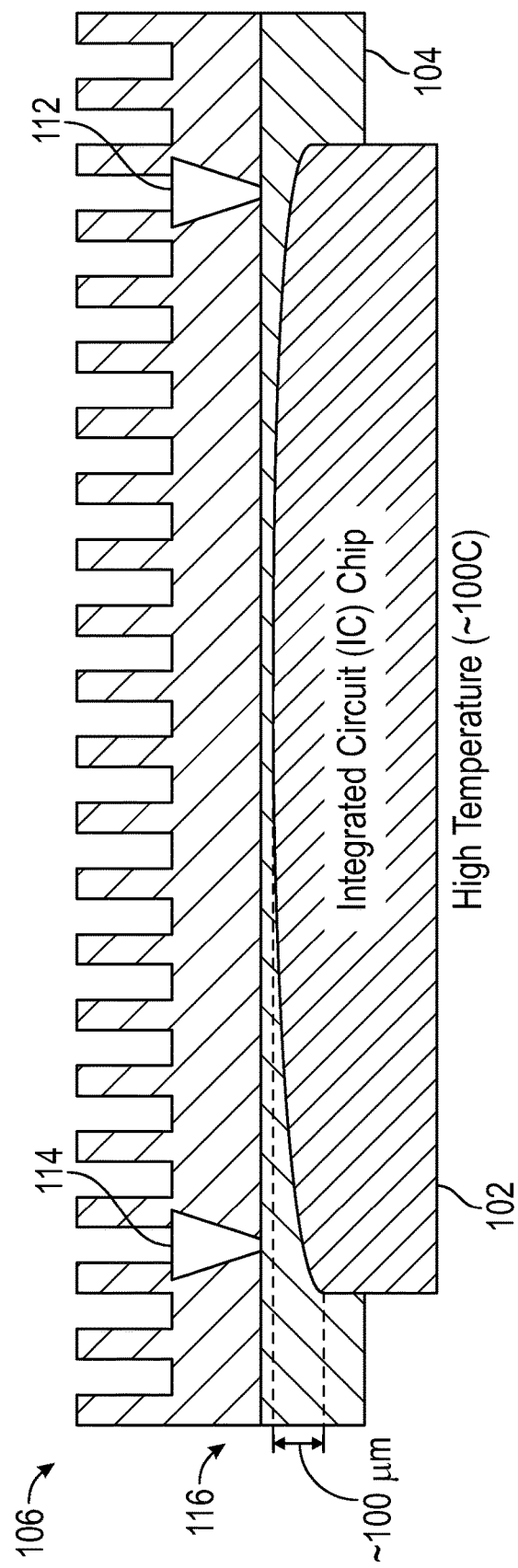

FIG. 2A and FIG. 2B illustrate warpage 116 of IC chip 102 at different temperatures. The lower temperature end of the thermal cycle of IC chip 102 is shown in FIG. 2A. At this lower temperature end (e.g., approximately 25 degrees Celsius) of the thermal cycle, warpage 116 of IC chip 102 may comprise approximately 200 µm for example. The higher temperature end (e.g., approximately 100 degrees Celsius) of the thermal cycle of IC chip 102 is shown in FIG. 2B. At this higher temperature end of the thermal cycle, warpage 116 of IC chip 102 may comprise approximately 100 µm for example.

FIG. 3A, FIG. 3B, FIG. 3C, FIG. 3D, FIG. 3E, and FIG. 3F illustrate TIM Pump-out due to thermal cycling. As IC chip 102 is operated, it may go through the thermal cycle where it may heat up for a period of time (i.e., higher temperature end of the thermal cycle) and then it may cool down for a period of time (i.e., lower temperature end of the thermal cycle). The increased heat may be caused by increasing the workload of IC chip 102 and the decreased heat may be caused by decreasing the workload of IC chip 102.

During each thermal cycle, warpage 116 of IC chip 102 may vary. A greater warpage 116 may occur at the lower temperature end of the thermal cycle and less warpage 116 may occur at the higher temperature end of the thermal cycle. FIG. 3A, FIG. 3B, FIG. 3C, FIG. 3D, FIG. 3E, and FIG. 3F illustrate this cycling over time. FIG. 3A shows TIM layer 104 between IC chip 102 and heatsink 106 in its initial state. During the thermal cycle, TIM layer 104 may be squeezed outward when IC chip 102 is heated up during the higher temperature end of the thermal cycle as illustrated by the arrows in FIG. 3B and FIG. 3D. Also during the thermal cycle, TIM layer 104 may be pulled back when IC chip 102 is cooled down during the lower temperature end of the thermal cycle as illustrated by the arrows in FIG. 3C and FIG. 3E. Over many thermal cycles from FIG. 3B to FIG. 3C to FIG. 3D to FIG. 3E (e.g., repeated 1,000 times) this change in warpage 116 may pump out some of TIM layer 104 leaving void 302 (e.g., an air void) as shown in FIG. 3F.

Consistent with embodiments of the disclosure, first TIM storage chamber 112 may be positioned over a location in TIM layer 104 where a void may be expected to form. For example, a void (e.g., void 302) may be expected to form in TIM layer 104 closer to an edge of IC chip 102. TIM in first TIM storage chamber 112 disposed in heatsink 106 over void 302 may melt during a higher temperature end of the thermal cycle of IC chip 102. A portion of the melted TIM from first TIM storage chamber 112 may fill void 302 in TIM layer 104. Then the remaining TIM in first TIM storage chamber 112 may solidify during a lower temperature end of the thermal cycle of IC chip 102.

The plurality of TIM storage chambers may be filled with enough TIM material to fill voids in TIM layer 104 multiple times. In other words, the aforementioned TIM pump-out issue may cause repeated voids in TIM layer 104 even after void 302 is filled from first TIM storage chamber 112 as described above. Accordingly, the plurality of TIM storage chambers may contain enough TIM material to fill voids "n" number of times (e.g., n=4 to 8) that may be cause by additional TIM pump-out cycles. This may be accomplished, for example, by making each of the plurality of TIM storage chambers have a sufficient volume and by include a sufficient number of TIM storage chambers in the plurality of TIM storage chambers.

Consistent with embodiments of the disclosure, the lower temperature end of the thermal cycle may comprise a lower temperature range between 20 degrees Celsius and 40 degrees Celsius inclusively for example. The higher temperature end of the thermal cycle may comprise a higher temperature range between 100 degrees Celsius and 125 degrees Celsius inclusively for example. The TIM comprising TIM layer 104 and used to fill the plurality of TIM storage chambers may comprise the same material and may be solid at temperatures, for example, lower than 45 degrees Celsius so the TIM may be stored in the plurality of TIM storage chambers at room ambient for example. Furthermore, the TIM comprising TIM layer 104 and used to fill the plurality of TIM storage chambers may turn to liquid at temperatures, for example, higher than 45 degrees Celsius, which may allow it to flow freely and to fill in any potential voids (e.g., void 302) that may be caused by the TIM pump-out problem.

Figure 4A:
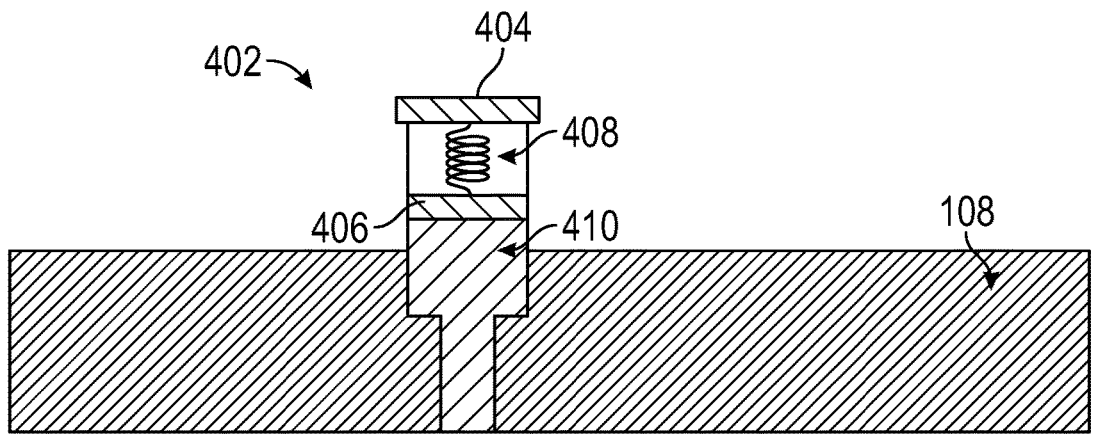
FIG. 4A, FIG. 4B, FIG. 4C, and FIG. 4D illustrate a pump for the TIM storage chamber.

FIG. 4A, FIG. 4B, FIG. 4C, and FIG. 4D illustrate a pump for the TIM storage chamber. For example, ones of the plurality of TIM storage chambers may comprise a compression device configured to create pressure on the TIM in the ones of the plurality of TIM storage chambers. As shown in FIG. 4A, a TIM storage chamber 402 disposed in plate 108 may comprise a cap 404, a piston 406, and a compression device 408 disposed between cap 404 and piston 406.

Compression device 408 may comprise, but is not limited to, a spring. When TIM 410 melts and leaves TIM storage chamber 402 to fill a void (e.g., void 302) as described above, compression device 408 may cause positive pressure on TIM 410 and aid in forcing TIM 410 out of TIM storage chamber 402 when TIM 410 is in the liquid state. It may not force TIM 410 out of TIM storage chamber 402 when TIM 410 is in the solid state.

Figure 4B:
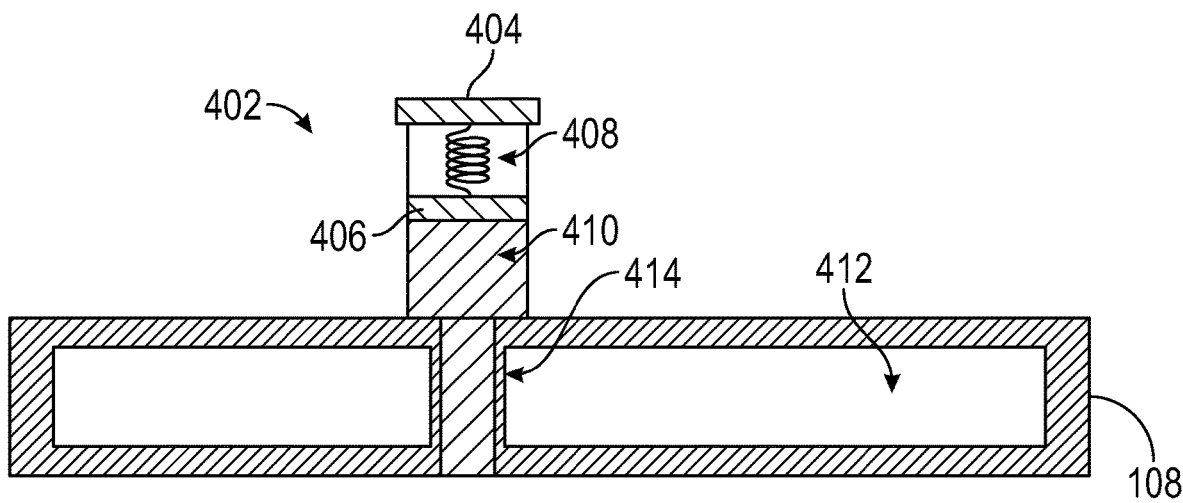
Figure 4C:
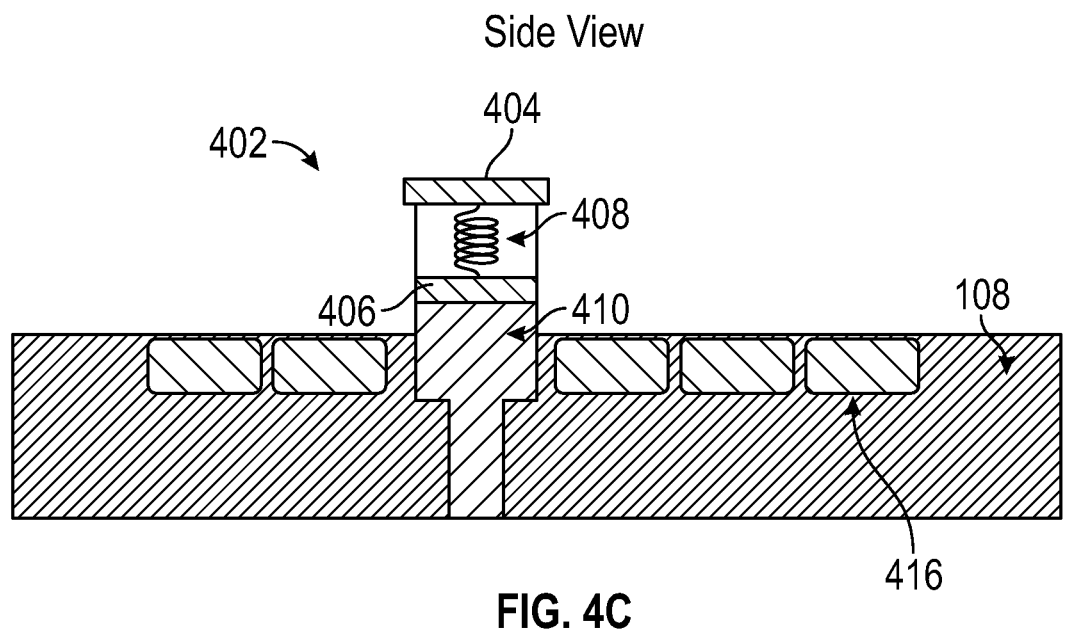
Figure 4D:
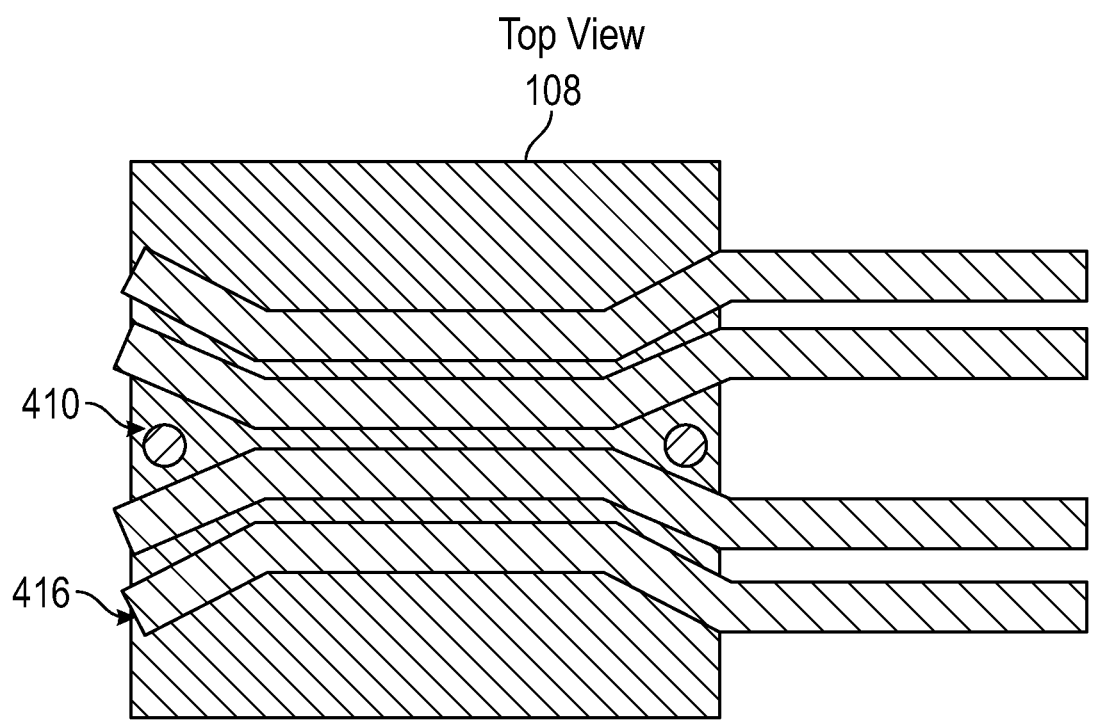

FIG. 4B illustrates plate 108 having a vapor chamber 412. Consistent with embodiments of the disclosure, a TIM storage chamber (e.g., TIM storage chamber 402) may be disposed in in a pillar 414 located in vapor chamber 412 of plate 108. FIG. 4C and FIG. 4D illustrate plate 108 having heat pipes 416. Consistent with embodiments of the disclosure, a TIM storage chamber (e.g., TIM storage chamber 402) may be disposed between heat pipes 416 of plate 108. Heat pipes 416 may vent to a remote radiator.

Figure 5:
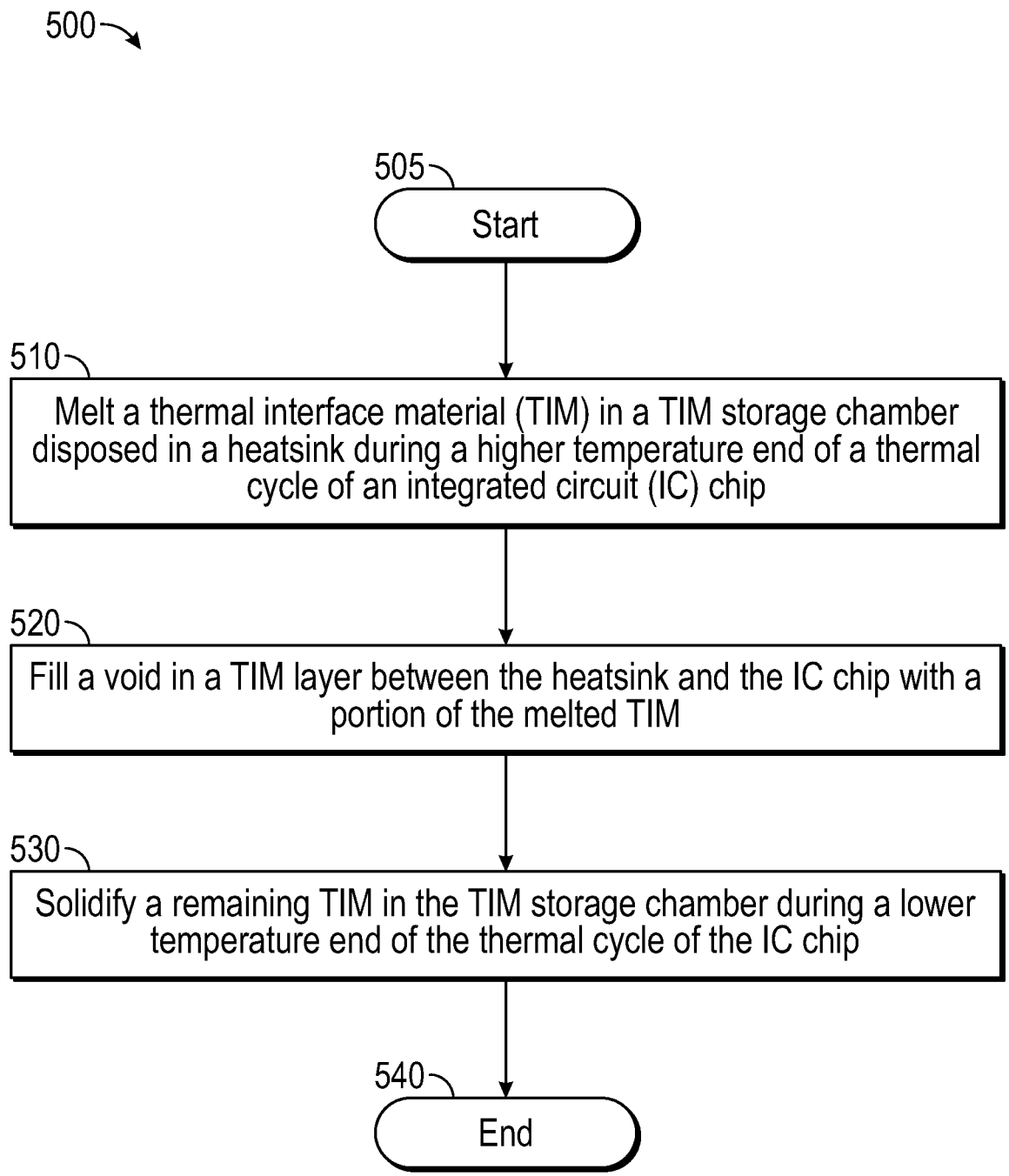
FIG. 5 is a flow chart setting forth the general stages involved in a method for providing TIM filling.

FIG. 5 is a flow chart setting forth the general stages involved in a method 500 consistent with embodiments of the disclosure for providing TIM filling. Method 500 may be implemented as described in more detail above. Ways to implement the stages of method 500 will be described in greater detail below.

Method 500 may begin at starting block 505 and proceed to stage 510 where TIM in first TIM storage chamber 112 disposed in heatsink 106 may be melted during a higher temperature end of a thermal cycle of IC chip 102. For example, consistent with embodiments of the disclosure and as described above with respect to FIG. 3A, FIG. 3B, FIG. 3C, FIG. 3D, FIG. 3E, and FIG. 3F, first TIM storage chamber 112 may be positioned over a location in TIM layer 104 where a void may be expected to form. For example, a void (e.g., void 302) may be expected to form in TIM layer 104 closer to an edge of IC chip 102. TIM in first TIM storage chamber 112 disposed in heatsink 106 over void 302 may melt during the higher temperature end of the thermal cycle of IC chip 102.

From stage 510, where TIM in first TIM storage chamber 112 disposed in heatsink 106 is melted during the higher temperature end of the thermal cycle of IC chip 102, method 500 may advance to stage 520 where a void (e.g., void 302) may be filled in TIM layer 104 between heatsink 106 and IC chip 102 with a portion of melted TIM from first TIM storage chamber 112. For example, the portion of melted TIM from first TIM storage chamber 112 may fill void 302 in TIM layer 104.

After the void (e.g., void 302) is filled in TIM layer 104 between heatsink 106 and IC chip 102 with the portion of melted TIM in stage 520, method 500 may continue to stage 530 where a remaining TIM in first TIM storage chamber 112 may be solidified during a lower temperature end of the thermal cycle of IC chip 102. For example, the remaining TIM in first TIM storage chamber 112 may solidify during the lower temperature end of the thermal cycle of IC chip 102. Once the remaining TIM in first TIM storage chamber 112 is solidified during the lower temperature end of the thermal cycle of IC chip 102 in stage 530, method 500 may then end at stage 540.

Embodiment of the disclosure may comprise a system for providing TIM filling. The system may comprise an Integrated Circuit (IC) chip, a Thermal Interface Material (TIM) layer disposed on the IC chip, and a heatsink disposed on the TIM layer. The heatsink may comprise a plate, a plurality of fins, and at least one TIM storage chamber disposed in the plate between two of the plurality of fins. The at least one TIM storage chamber may be filled with a TIM that is solid at a lower temperature end of a thermal cycle of the IC chip and that is liquid at a higher temperature end of the thermal cycle of the IC chip. The at least one TIM storage chamber may further comprise a first opening in a top side of the plate and a second opening in a bottom side of the plate. The first opening may be larger than the second opening. The at least one TIM storage chamber may comprise a conical frustum. The at least one TIM storage chamber may be positioned over an expected void in the TIM layer. The at least one TIM storage chamber may comprise a compression device configured to create pressure on the TIM in the at least one TIM storage chamber. The TIM may comprise a grease. The TIM may comprise a Phase Change Material (PCM). The lower temperature end of the thermal cycle may comprise a range between 20 degrees Celsius and 40 degrees Celsius inclusively and the higher temperature end of the thermal cycle may comprise a range between 100 degrees Celsius and 125 degrees Celsius inclusively. The plate may comprise a vapor chamber. The at least one TIM storage chamber may be located in a column of the vapor chamber. The plate may comprise heat pipes. The at least one TIM storage chamber may be located between the heat pipes. The at least one TIM storage chamber may be filled with enough TIM material to fill voids in the TIM layer multiple times. The IC chip may comprise an Application Specific Integrated Circuit (ASIC).

Embodiments of the disclosure may comprise a system for providing TIM filling. The system may comprise an Integrated Circuit (IC) chip, a Thermal Interface Material (TIM) layer disposed on the IC chip, and a heatsink disposed on the TIM layer. The heatsink may comprise a plate and a plurality of TIM storage chambers disposed in the plate. Each of the plurality of TIM storage chambers may be filled with a TIM that may be solid at a lower temperature end of a thermal cycle of the IC chip and that may be liquid at a higher temperature end of the thermal cycle of the IC chip. Each of the plurality of TIM storage chambers may comprise a first opening in a top side of the plate and a second opening in a bottom side of the plate. The lower temperature end of the thermal cycle may comprise a range between 20 degrees Celsius and 40 degrees Celsius inclusively and the higher temperature end of the thermal cycle may comprise a range between 100 degrees Celsius and 125 degrees Celsius inclusively. The at least one TIM storage chamber may be filled with enough TIM material to fill voids in the TIM layer multiple times.

Embodiments of the disclosure may comprise a method for providing TIM filling. The method may comprise melting a Thermal Interface Material (TIM) in a TIM storage chamber disposed in a heatsink during a higher temperature end of a thermal cycle of an Integrated Circuit (IC) chip, filling a void in a TIM layer between the heatsink and the IC chip with a portion of the melted TIM, and solidifying a remaining TIM in the TIM storage chamber during a lower temperature end of the thermal cycle of the IC chip. The lower temperature end of the thermal cycle may comprise a range between 20 degrees Celsius and 40 degrees Celsius inclusively and the higher temperature end of the thermal cycle may comprise a range between 100 degrees Celsius and 125 degrees Celsius inclusively. The at least one TIM storage chamber may be positioned over an expected void in the TIM layer.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

The invention claimed is:

1. A system comprising:
an Integrated Circuit (IC) chip;
a Thermal Interface Material (TIM) layer disposed on the IC chip; and
a heatsink disposed on the TIM layer, the heatsink comprising,
a plate,
a plurality of fins, and
at least one TIM storage chamber disposed in the plate between two consecutive fins of the plurality of fins, wherein the at least one TIM storage chamber is filled with a TIM that is solid at a lower temperature end of a thermal cycle of the IC chip and that is liquid at a higher temperature end of the thermal cycle of the IC chip, wherein the at least one TIM storage chamber comprises an inverted conical frustum disposed entirely in the plate with a top side of the at least one TIM storage chamber being flush with a top side of the plate, and wherein the at least one TIM storage chamber is connected to the TIM layer such that the TIM in the at least one TIM storage chamber can flow into the TIM layer.

2. The system of claim 1, wherein the at least one TIM storage chamber comprises:
a first opening in the top side of the plate; and
a second opening in a bottom side of the plate.

3. The system of claim 2, wherein the first opening is larger than the second opening.

4. The system of claim 1, wherein the at least one TIM storage chamber is positioned over an expected void in the TIM layer.

5. The system of claim 1, wherein the at least one TIM storage chamber comprises a compression device configured to create pressure on the TIM in the at least one TIM storage chamber.

6. The system of claim 1, wherein the TIM comprises a Phase Change Material (PCM).

7. The system of claim 1, wherein the lower temperature end of the thermal cycle comprises a lower temperature range between 20 degrees Celsius and 40 degrees Celsius inclusively and the higher temperature end of the thermal cycle comprises a higher temperature range between 100 degrees Celsius and 125 degrees Celsius inclusively.

8. The system of claim 1, wherein the plate comprises a vapor chamber.

9. The system of claim 8, wherein the at least one TIM storage chamber is located in a column of the vapor chamber.

10. The system of claim 1, wherein the plate comprises heat pipes.

11. The system of claim 10, wherein the at least one TIM storage chamber is located between the heat pipes.

12. The system of claim 1, wherein the at least one TIM storage chamber is filled with enough TIM material to fill voids in the TIM layer multiple times.

13. The system of claim 1, wherein the IC chip comprises an Application Specific Integrated Circuit (ASIC).

14. A system comprising:
an Integrated Circuit (IC) chip;
a Thermal Interface Material (TIM) layer disposed on the IC chip; and
a heatsink disposed on the TIM layer, the heatsink comprising,
a plate, and
a plurality of TIM storage chambers disposed in the plate, wherein each of the plurality of TIM storage chambers is filled with a TIM that is solid at a lower temperature end of a thermal cycle of the IC chip and that is liquid at a higher temperature end of the thermal cycle of the IC chip, each of TIM storage chambers disposed in the plate between two consecutive fins of a plurality of fins, wherein each of the plurality of TIM storage chambers comprises an inverted conical frustum having a first opening in a top side of the plate and a second opening in a bottom side of the plate, the conical frustum disposed entirely within the plate with a top side of the at least one TIM storage chamber being flush with the top side of the plate, and wherein each of the plurality of TIM storage chambers is connected to the TIM layer such that the TIM in the plurality of TIM storage chambers can flow into the TIM layer.

15. The system of claim 14, wherein the lower temperature end of the thermal cycle comprises a lower temperature range between 20 degrees Celsius and 40 degrees Celsius inclusively and the higher temperature end of the thermal cycle comprises a higher temperature range between 100 degrees Celsius and 125 degrees Celsius inclusively.

16. The system of claim 14, wherein the plurality of TIM storage chambers are filled with enough TIM material to fill voids in the TIM layer multiple times.

17. A method comprising:
melting a Thermal Interface Material (TIM) in a TIM storage chamber disposed in a heatsink during a higher temperature end of a thermal cycle of an Integrated Circuit (IC) chip, wherein the TIM storage chamber disposed in a plate between two consecutive fins of a plurality of fins;
filling a void in a TIM layer between the heatsink and the IC chip with a portion of melted TIM from the TIM storage chamber, wherein the at least one TIM storage chamber comprises an inverted conical frustum disposed entirely in the plate with a top side of the at least one TIM storage chamber being flush with a top side of the plate, and wherein the TIM storage chamber is connected to the TIM layer such that the TIM in the TIM storage chamber can flow into the TIM layer; and
solidifying a remaining TIM in the TIM storage chamber during a lower temperature end of the thermal cycle of the IC chip.

18. The method of claim 17, wherein the lower temperature end of the thermal cycle comprises a lower temperature range between 20 degrees Celsius and 40 degrees Celsius inclusively and the higher temperature end of the thermal cycle comprises a higher temperature range between 100 degrees Celsius and 125 degrees Celsius inclusively.

19. The method of claim 17, wherein the TIM storage chamber is positioned over where the void is expected in the TIM layer.

20. The method of claim 17, wherein the at least one TIM storage chamber comprises a compression device configured to create pressure on the TIM in the at least one TIM storage chamber.

* * * * *